(12) United States Patent
Kwon et al.

(10) Patent No.: US 10,852,617 B2
(45) Date of Patent: Dec. 1, 2020

(54) LIGHT COMB GENERATING DEVICE AND SPECTROMETERS INCLUDING SAME

(71) Applicant: ELECTRONICS AND TELECOMMUNICATIONS RESEARCH INSTITUTE, Daejeon (KR)

(72) Inventors: Oh Kee Kwon, Sejong (KR); Kisoo Kim, Seoul (KR); Sung Bock Kim, Daejeon (KR); Young Ahn Leem, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/295,786

(22) Filed: Mar. 7, 2019

(65) Prior Publication Data

US 2019/0278151 A1    Sep. 12, 2019

(30) Foreign Application Priority Data

Mar. 7, 2018  (KR) .................. 10-2018-0027098

(51) Int. Cl.
| | |
|---|---|
| *G02F 1/21* | (2006.01) |
| *H01S 5/14* | (2006.01) |
| *G01J 3/42* | (2006.01) |
| *G01J 3/10* | (2006.01) |

(52) U.S. Cl.
CPC .............. *G02F 1/21* (2013.01); *G01J 3/10* (2013.01); *G01J 3/42* (2013.01); *H01S 5/141* (2013.01); *G01J 2003/102* (2013.01); *G02F 2001/212* (2013.01); *G02F 2203/50* (2013.01); *G02F 2203/56* (2013.01)

(58) Field of Classification Search
CPC ......... G01J 2003/102; G01J 3/10; G01J 3/42; G01J 3/433; G01J 3/453; G01J 3/457; G02F 1/21; G02F 2001/212; G02F 2203/50; G02F 2203/56; H01S 5/0085; H01S 5/141
See application file for complete search history.

(56) References Cited

U.S. PATENT DOCUMENTS

| | | | |
|---|---|---|---|
| 8,564,785 B2 | 10/2013 | Newbury et al. | |
| 8,693,004 B2 | 4/2014 | Chandler et al. | |
| 9,252,560 B2 * | 2/2016 | Fermann ................ | G01N 21/31 |

(Continued)

OTHER PUBLICATIONS

Millot, et al., "Frequency-Agile Dual-Comb Spectroscopy," Nature Photonics, 2016, vol. 10, pp. 27-30.

(Continued)

*Primary Examiner* — Marcus H Taningco

(57) ABSTRACT

A light comb generating device according to a disclosed embodiment includes a light source for generating light in a reference wavelength band and outputting the generated light, and an optical comb generator for generating a light comb having a reference comb interval from the output light, wherein the light source changes a wavelength of the output light as much as a reference frequency interval for every reference time interval, the light comb is generated within a wavelength range of the reference frequency interval, and the reference wavelength band may be at least about 3 μm and no greater than about 30 μm.

13 Claims, 8 Drawing Sheets

(56) References Cited

U.S. PATENT DOCUMENTS

| | | | |
|---|---|---|---|
| 9,557,219 B2* | 1/2017 | Newbury | |
| 9,653,877 B1* | 5/2017 | Arissian | G01N 21/41 |
| 9,859,677 B1* | 1/2018 | Arissian | G01N 21/41 |
| 10,020,635 B1* | 7/2018 | Lyakh | H01S 5/3401 |
| 10,224,688 B2* | 3/2019 | Koptyaev | H01S 5/005 |
| 10,295,464 B2* | 5/2019 | Scherer | G01N 21/39 |
| 2015/0002918 A1 | 1/2015 | Kwon et al. | |
| 2017/0244218 A1 | 8/2017 | Oh | |
| 2017/0256909 A1* | 9/2017 | Braddell | G01J 3/42 |
| 2018/0045596 A1* | 2/2018 | Prasad | G01M 3/16 |
| 2018/0252985 A1* | 9/2018 | Vainio | H01S 3/0092 |
| 2019/0312402 A1* | 10/2019 | Lucas | G02F 1/3536 |

OTHER PUBLICATIONS

Yan, et al., "Mid-Infrared and Near-Infrared Dual-Comb Spectroscopy with Electro-Optic Modulators," Light, Energy, and the Environment, OSA Technical Digest, 2016, pp. 3.

* cited by examiner

LIGHT COMB GENERATING DEVICE AND SPECTROMETERS INCLUDING SAME

CROSS-REFERENCE TO RELATED APPLICATIONS

This U.S. non-provisional patent application claims priority under 35 U.S.C. § 119 of Korean Patent Application No. 10-2018-0027098, filed on Mar. 7, 2018, the entire contents of which are hereby incorporated by reference.

BACKGROUND

The present disclosure relates to a light comb generating device and spectrometers including the same, and more particularly, to a device for generating a light comb from light in a mid-infrared wavelength band and spectrometers using the same.

Spectrometers are devices with which the frequency of a radiation may be measured and analyzed, and which may be used in the field of optical measurement and survey, and have recently been used widely in the fields of probes and sensors. The gas sensor using a spectrometer uses a method in which absorbance in a wavelength band corresponding to the natural vibration mode of gas molecules. The gas sensor using a spectrometer can be said to be a sensor of a type which recognizes an inherent fingerprints of molecules, and may therefore be implemented as a high-precision, high-sensitive sensor compared to existing gas sensors using chemical or electrical methods.

The spectrometer may decompose incident light through a configuration using a dispersive system such as a prism or a diffraction grating or through a configuration using an interferometer and Fourier transformed-infrared (FT-IR), and arrange the decomposed incident light according to frequencies. In addition, the spectrometer may analyze the absorption spectrum of transmitted or reflected light after allowing the light to be incident on a sample.

SUMMARY

The present disclosure provides a light comb generating device and spectrometers including the same in a mid-infrared wavelength band.

The technical problem aimed by the present disclosure is not limited to the aforementioned technical problems, and other technical problems may be inferred from the following exemplary embodiments.

An embodiment of the inventive concept provides a light comb generating device including: a light source for generating light in a mid-infrared wavelength band and outputting the generated light; and an optical comb generator for generating a light comb having a reference comb interval from the output light, wherein the light source may change a wavelength of the output light as much as a reference frequency interval for every reference time interval. In an embodiment, the light comb may be generated within a wavelength range of the reference frequency interval, and a reference wavelength band of the mid-infrared wavelength band may be at least about 3 μm and no greater than about 30 μm.

In an embodiment of the inventive concept, a spectrometer for analyzing characteristics of a sample includes: a cell for filling a sample thereinto; a light transceiver for transmitting or receiving light in a mid-infrared wavelength band; and a dual optical comb generator for generating a first light comb and a second light comb from the light received from the light transceiver, wherein the first light comb and the second light comb respectively have a first frequency interval and a second frequency interval, wherein the first light comb returns to the dual optical comb generator after passing through the cell; and the dual optical comb generator may transmit, to the light transceiver, an optical signal in which the generated second light comb and the returned first light comb are combined.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, several exemplary embodiments will be explained clearly and in detail with reference to the accompanying drawings so that those with ordinary skill (hereinafter referred to as an ordinary technical experts) in the technical field to which the present disclosure belongs may easily embody the present disclosure.

According to an embodiment, a spectrometer using an interferometer may use wavelength-tunable coherent light instead of broadband incoherent light in order to remove a mechanical displacement of a reference arm. When a wavelength-tunable light source is excited while fixed to a specific wavelength, the spectrometer using the wavelength-tunable light source may generate a high-output light with a very narrow line width. However, when increasing the wavelength tuning speed, a problem may occur in which the instantaneous line width of output light increases, and the output of the light is remarkably reduced (when a tuning time is shorter than a round-trip time for oscillation inside a resonator). In particular, when a wavelength tuning operations are repeated with a repetition rate of at least MHz, the resolution and sensitivity of the spectrometer are degraded, and thus, the embodiment of a real-time mixed-gas detection system may be difficult.

Since the absorption strength of a mid-infrared wavelength band (mid-IR: operation wavelength of about 3 μm to about 30 μm) is at least 10,000 times higher than that of a near-infrared wavelength band which is an optical communication wavelength band, development of a spectrometer operating at a mid-infrared wavelength band is being demanded recently. A mid-infrared wavelength band spectrometer may be constituted by disposing, with respect to a light source which outputs light in a near-infrared (near IR) wavelength band, an optical comb generator for generating a light comb having frequency intervals different from each other. In this case, the mid-infrared wavelength band spectrometer may operate by converting the output of the light source into a mid-infrared (mid-IR) band through a difference frequency generation (DFG) method. However, expensive optical components may be required for implementation of a broadband optical comb generator and mid-infrared conversion, and a high power may be required due to a low DFG conversion efficiency.

Figure 1:
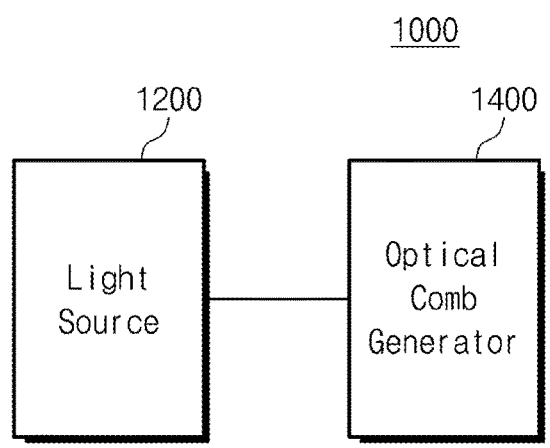
FIG. 1 illustrates a block diagram of a light comb generating device according to an embodiment.
Figure 2:
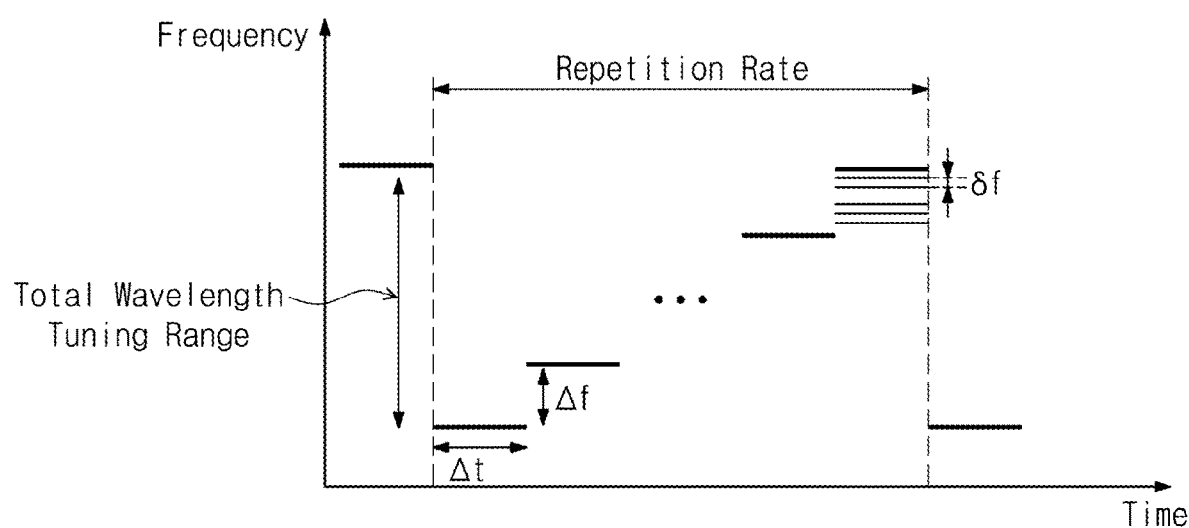
FIG. 2 is a conceptual view for further describing operations of a light comb generating device according to an embodiment.

FIG. 1 illustrates a block diagram of a light comb generating device according to an embodiment. FIG. 2 is a conceptual view for further describing operations of a light comb generating device according to an embodiment. Referring to FIGS. 1 and 2 together, operations of a light comb generating device 1000 will be described.

A light comb generating device 1000 may include a light source 1200 and an optical comb generator 1400.

The light source 1200 may generate light in a reference wavelength band and output the generated light. The reference wavelength band may mean a mid-infrared wavelength band having a wavelength band of at least about 3 μm and no greater than about 30 μm.

Referring to FIG. 2, the light source 1200 may change the wavelength of light, which is output for every reference time interval Δt with respect to the total wavelength tuning range, stepwise according to a reference frequency interval Δf. The light source 1200 may periodically repeat an operation of discretely increasing the wavelength of light on the basis of a repetition rate. For example, the light source 1200 may stepwisely change the wavelength of the output light starting from an initial frequency $f_0$ from time $t_0$ to time $t_1$ according to a reference frequency interval Δf. Upon reaching time $t_1$, the light source 1200 may stepwisely change again the wavelength of the output light starting from the initial frequency $f_0$ according to the reference frequency interval Δf. According to an embodiment, the repetition rate may be represented as N Hz, and in this case, the light source 1200 may repeat, N times per second, the operation of changing the wavelength of the light output within the total wavelength tuning range. The light source 1200 may be implemented as a wavelength-tunable laser, but the embodiment of the inventive concept is not limited thereto.

The optical comb generator 1400 may generate a light comb having a reference comb interval from the light output from the light source 1200. The light comb may include a plurality of light comb lines spaced apart from each other at the reference comb interval. Referring to FIG. 2, the optical comb generator 1400 may generate a light comb having a reference comb interval δf within a wavelength range centering on the wavelength output from the light source 1200. The size of the wavelength range means the size of the reference frequency interval Δf.

Figure 3:
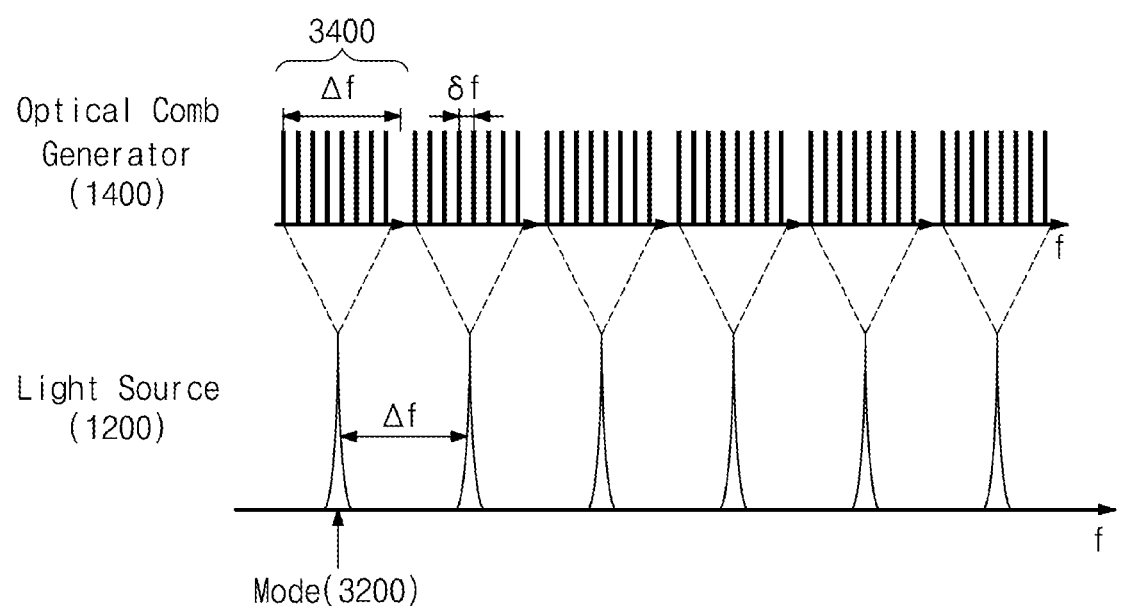
FIG. 3 is a conceptual view for further describing operations of a light comb generating device according to an embodiment.

FIG. 3 is a conceptual view for further describing operations of a light comb generating device according to an embodiment. Referring to FIG. 3, the optical comb generator 1400 of FIG. 1 may generate a light comb having discrete light comb lines at reference comb intervals within a reference frequency interval Δf for every optical mode (that is, wavelength) generated from the light source 1200. For example, a light comb 3400 having a reference comb interval δf may be generated with respect to the optical mode 3200.

When analyzing the absorption spectrum of gas molecules, about 10 or more radiations may normally be present at one wavenumber (1/cm), for example, at about 30 GHz. Thus, according to an embodiment, the sensor may detect radiations from gas molecules on the basis of light combs having comb intervals no greater than about 300 MHz which is 1/100 of 30 GHz.

According to an embodiment, the light comb generating device 1000 may obtain a stabilization time as much as the reference time interval (for example, Δt of FIG. 2), compared to a device which uses a method of linearly sweeping a diffraction grating or a wavelength tuning part in order to change the wavelength of the light output from the light source. Therefore, the problem of increase in the line width of output light and decrease in light output may be improved, and a high-speed operation may be performed. In addition, the light comb generating device 1000 of FIG. 1 may generate a broadband light comb through the combination of the wavelength-tunable light source 1200 and the optical comb generator 1400, and may therefore operate with low costs and low power.

Figure 4:
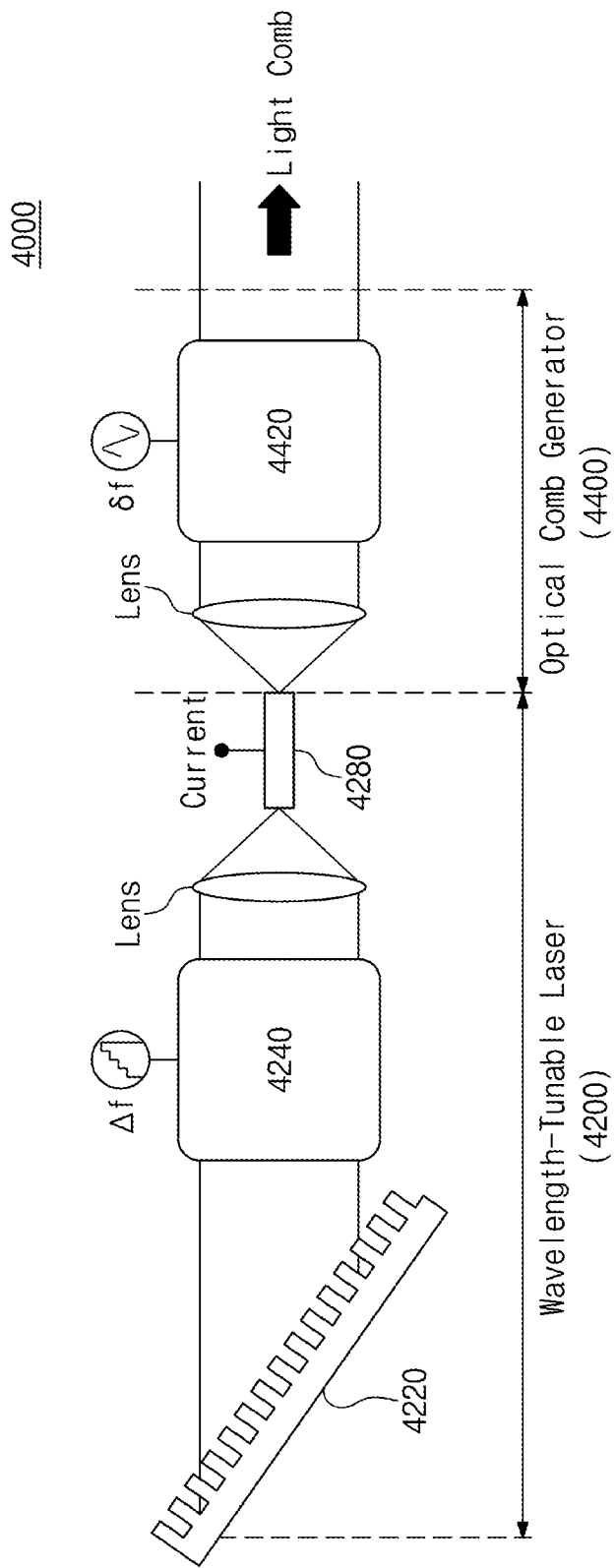
FIG. 4 illustrates a detailed configuration of a light comb generating device according to an embodiment.

FIG. 4 illustrates a detailed configuration of a light comb generating device according to an embodiment.

A light comb generating device 4000 may correspond to the light comb generating device 1000 described above with reference to FIG. 1. A wavelength-tunable laser 4200 may correspond to the light source 1200 of FIG. 1, and an optical comb generator 4400 may correspond to the optical comb generator 1400. Thus, hereinafter although omitted, the matters described about the light source 1200 and the optical comb generator 1400 of FIG. 1 may also be applied to the wavelength-tunable laser 4200 and the optical comb generator 440 of FIG. 4.

The wavelength-tunable laser 4200 may generate light in a mid-infrared wavelength band and output the generated light. The wavelength-tunable laser 4200 may discretely tune the wavelength of light, which is output at every reference time interval Δt, according to a reference frequency interval Δf. The wavelength-tunable laser 4200 may include a diffraction grating 4220, a beam deflector 4240, and an optical gain medium 4280.

The diffraction grating 4220 may generate, using the diffraction effect of light, output light at different angles according to the wavelength of the light incident in a specific direction. The beam deflector 4240 is a device for deflecting incident light. The optical gain medium 4280 may generate light when a current is applied thereto. The optical gain medium 4280 may be composed of a semiconductor diode, and may generate light in a mid-infrared wavelength band through an intra-band transition or an inter-band transition which is generated by applying a current thereto.

The light generated from the wavelength-tunable laser 4200 may be generated by causing the light generated by applying a current to the optical gain medium 4280 to pass through the beam deflector 4240 and the diffraction grating 4220. According to an embodiment, the light generated by applying a current to the optical gain medium 4280 passes through the beam deflector 4240 and the diffraction grating 4220, and only a beam in a specific wavelength band is reflected from the diffraction grating 4220 and returns to the optical gain medium 4280.

Through the above operations, resonance is generated and specific-wavelength light may be generated. According to an embodiment, the wave front of a beam is changed by applying an electrical signal (voltage or current) to the beam deflector 4240, or the incident angle to the diffraction grating 4220 is changed and thus, the wavelength of the light reflected from the diffraction grating 4220 is changed. Thus, the wavelength (or frequency) of light output from the wavelength-tunable laser 4200 may be determined.

The optical comb generator 4400 may generate a light comb from the light generated from the wavelength-tunable laser 4200. According to an embodiment, the optical comb generator 4400 may include a harmonic modulator 4420, and the harmonic modulator 4420 may generate a harmonic wave of light corresponding to the modulation frequency. Thus, the optical comb generator 4400 may adjust the generated reference comb interval on the basis of the modulation frequency.

The harmonic modulator 4420 may be implemented in various forms. According to an embodiment, when an intensity modulator and a phase modulator are coupled in series, and the frequency of the phase modulator is modulated to be the same as the frequency of the intensity modulator using a voltage of integral multiple of $2\pi$, the harmonic modulator 4420 may be implemented such that a light comb is generated under a specific phase difference condition between the intensity modulator and the phase modulator, but the embodiment of the inventive concept is not limited thereto. According to an embodiment, the harmonic modulator 4420 may be implemented as a combination of phase modulators instead of the intensity modulator. For example, a phase difference is generated in the upper arm and the lower arm of a Mach-Zender modulator, which is a parallel combination of the phase modulators, and then the Mach-Zender modulator is operated by a voltage of integral multiples of $2\pi$, so that a light comb may also be generated.

Figure 5:
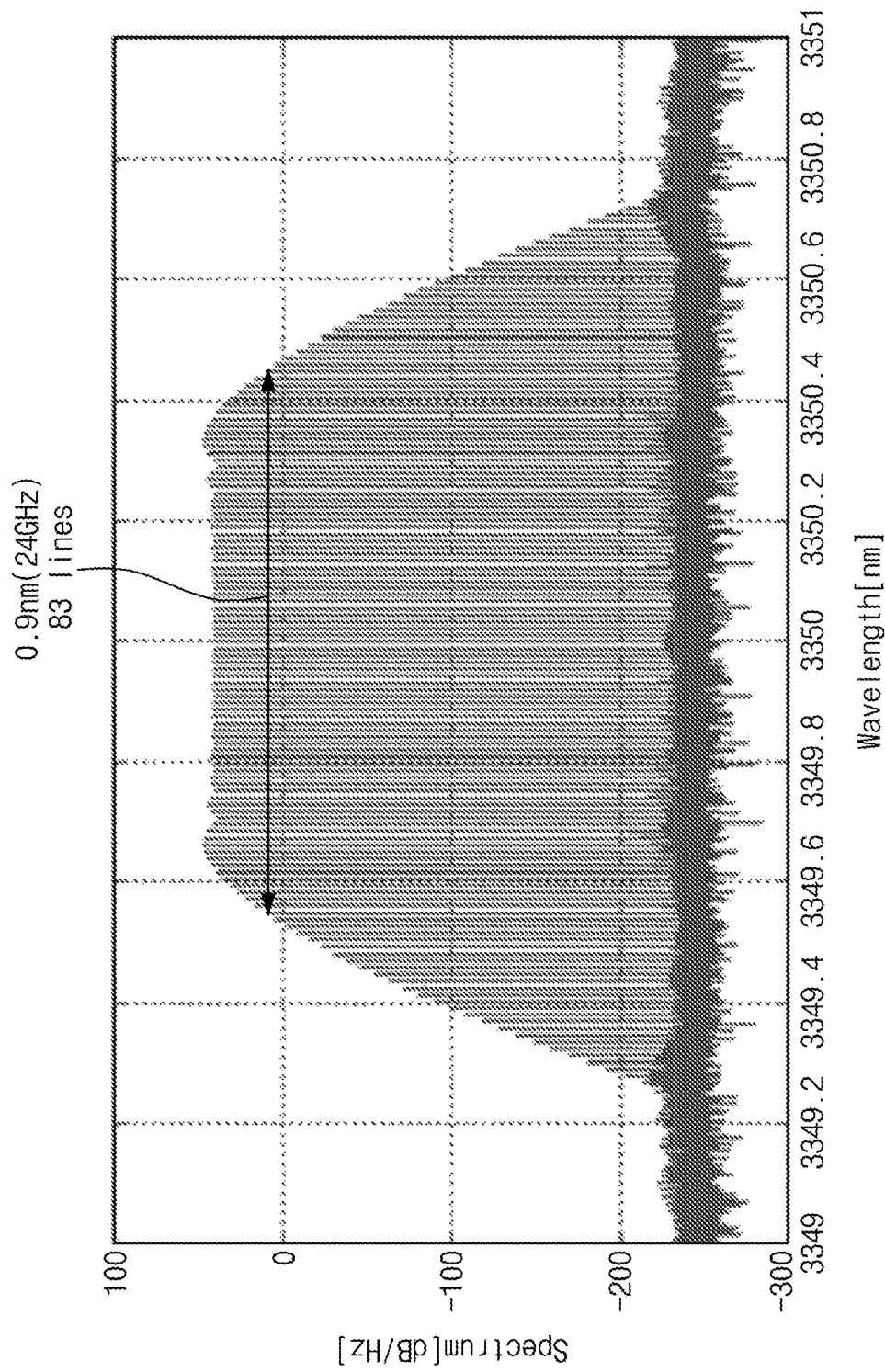
FIG. 5 illustrates a light comb generated according to an embodiment.

FIG. 5 illustrates a light comb when the central wavelength of the light output from the light source 4200 of FIG. 4 is about 3,350 nm, and the modulation frequency of the harmonic modulator 4420 is about 300 MHz. About 83 light comb lines which have a comb interval of about 300 MHz may be generated within a wavelength range of about 24 GHz. For example, the central wavelength (about 3,350 nm) of the light may correspond to the mode 3200 of FIG. 3, and the wavelength range (about 24 GHz) may correspond to the reference frequency interval $\Delta f$ of FIG. 3. In addition, the comb interval (about 300 MHz) may correspond to the reference comb interval $\delta f$ of FIG. 3. On the basis of generated 83 light combs, radiations may be detected from gas molecules.

Figure 6:
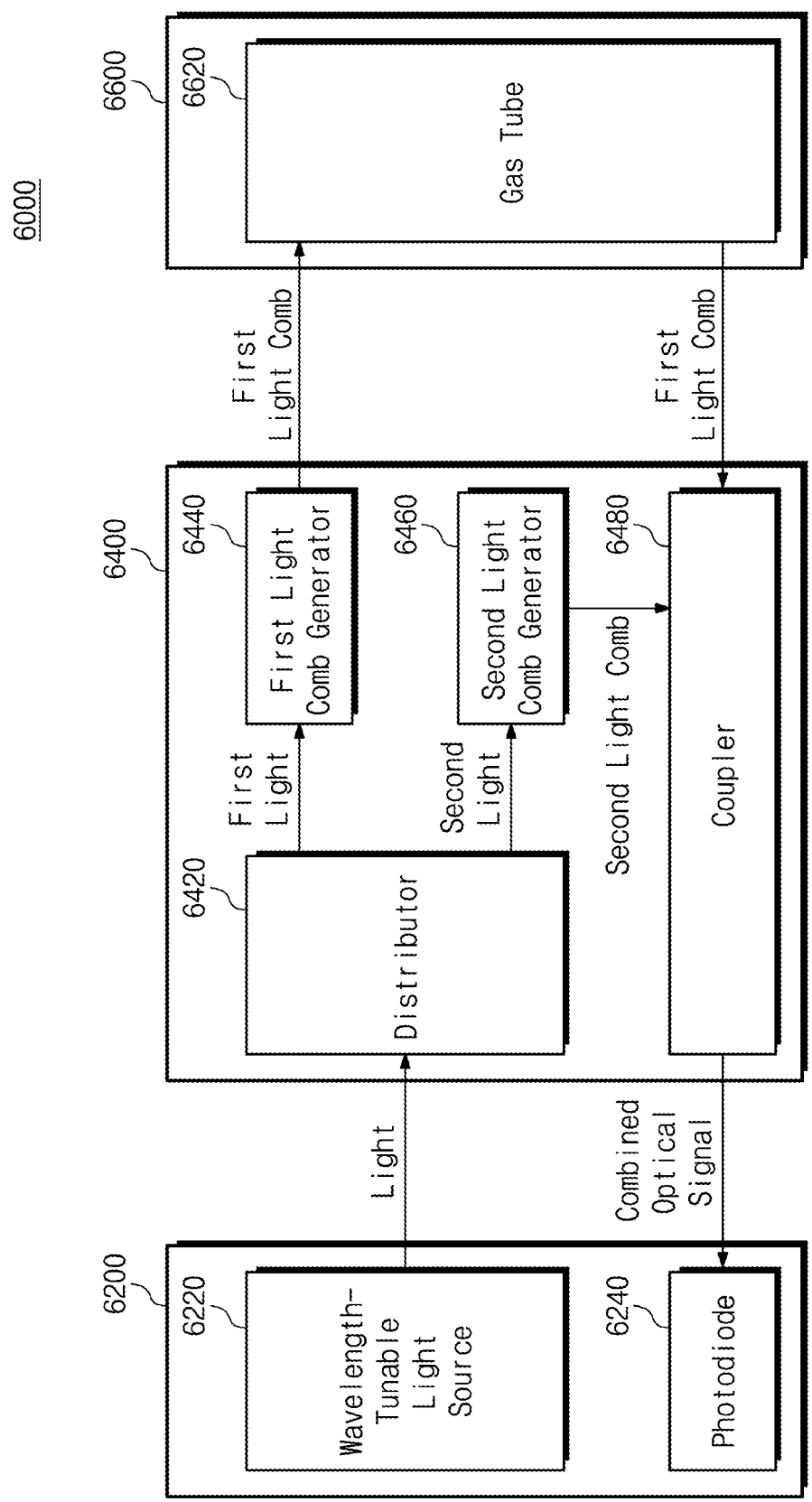
FIG. 6 illustrates a block diagram of a spectrometer used as a gas sensor according to an embodiment.

FIG. 6 illustrates a block diagram of a spectrometer used as a gas sensor according to an embodiment.

A spectrometer 6000 may include a light transceiver 6200, a dual optical comb generator 6400, and a gas cell 6600.

The light transceiver 6200 may transmit or receive light in a mid-infrared wavelength band. For example, the light transceiver 6200 may generate light in a mid-infrared wavelength band, and transmit the generated light to the dual optical comb generator 6400, or receive light in a mid-infrared wavelength band from the dual optical comb generator 6400 or the gas cell 6600. The light transceiver 6200 may include a wavelength-tunable light source 6220 and a photodiode 6240. The wavelength-tunable light source 6220 according to an embodiment may be implemented as the wavelength-tunable laser 4200 of FIG. 4. The single mode light (that is, specific wavelength light) generated from the wavelength-tunable light source 6220 may be transmitted to a distributor 6420 inside the dual optical comb generator 6400 via a reflector (for example, a mirror). The operation of the photodiode 6240 will be described later.

The dual optical comb generator 6400 may receive the mid-infrared wavelength light output from the light transceiver 6200 and generate a first light comb and a second light comb from the received light. For example, the dual optical comb generator 6400 may split the received light into two light (first light and second light). The dual optical comb generator 6400 may generate the first light comb with respect to the first light, and generate the second light comb with respect to the second light. The first light comb and the second light comb may be generated by using modulation frequencies different from each other.

The dual optical comb generator 6400 may include a distributor 6420, a first light comb generator 6440, a second light comb generator 6460, and a coupler 6480.

The distributor 6420 may separate the first light and the second light from the light, in a mid-infrared wavelength band, received from the light transceiver 6200. The distributor 6420 may mean an optical element which may allow the incident light to proceed through a plurality of paths. The first light may proceed along a first light path and the second light may proceed along a second light path. The first light path is a path reaching the coupler 6480 via the first light comb generator 6440 and a gas sample inside the gas cell 6600. The second light path is a path reaching the coupler 6480 via the second light comb generator 6460. Thus, the first light may be transmitted to the first light comb generator 6440, and the second light may be transmitted to the second light comb generator 6460.

The first light comb generator 6440 may generate the first light comb on the basis of the first light, and the second light comb generator 6440 may generate the second light comb on the basis of the second light. According to an embodiment, each of the first light comb generator 6440 and the second light comb generator 6460 may be implemented as the optical comb generator 4400 of FIG. 4. The first light comb is transmitted to the gas cell 6600.

The gas cell 6600 is a cell filled with a sample (for example, gas molecules) to measure. The gas cell 6600 may include a gas tube 6620 configured such that gas flows from a gas injection port to a gas discharge port. The first light comb may proceed through the gas tube 6620. The first light comb which passes through the sample inside the gas tube 6620 and reflected from the sample may be transmitted to the coupler 6480 inside the dual optical comb generator 6400.

The coupler 6480 may couple the second light comb received from the second optical generator 6460 and the first light comb received from the gas cell 6600, and generate a combined optical signal. According to an embodiment, the combined optical signal may be a signal generated because the first light comb and the second light comb interfere with each other. The coupler 6640 may transmit the combined optical signal to the photodiode 6240.

The photodiode 6240 may convert the combined optical signal received from the coupler 6480 into an electrical signal. The electrical signal generated by the photodiode 6240 may be frequency-transformed (for example, Fourier transform), and the frequency-transformed optical signal may be used to analyze the absorbance and/or components of the sample inside the gas cell 6600. The characteristics of the gas sample may be analyzed on the basis of the frequency-transformed optical signal. For example, the electrical signal generated by the photodiode 6240 may be frequency-transformed by a computer device outside the spectrometer 6000. The absorption spectrum of the gas sample may be analyzed on the basis of the frequency-transformed signal.

According to an embodiment, the higher the reference frequency interval of the wavelength-tunable light source 6220, the smaller (but, stability increases) the number of central wavelengths provided from the wavelength-tunable light source 6220 (for example, mode 3200 of FIG. 3), whereas the number of combs required to be generated from the dual optical comb generator 6400 may increase. Thus, according to the detected wavelength range of the sample (gas molecules), adjustment of an appropriate operation condition is required. In addition, since the light comb having the shape of FIG. 5 is generated for every reference frequency interval, the light comb at frequencies adjacent to the border line of the reference frequency interval may be obtained while overlapping each other according to a time interval. Thus, according to an embodiment, after the optical signal is converted into an electrical signal by the photodiode 6240, an appropriate Fourier transform technique, such as zero padding, may be used or a compensation filter may be used.

Figure 7:
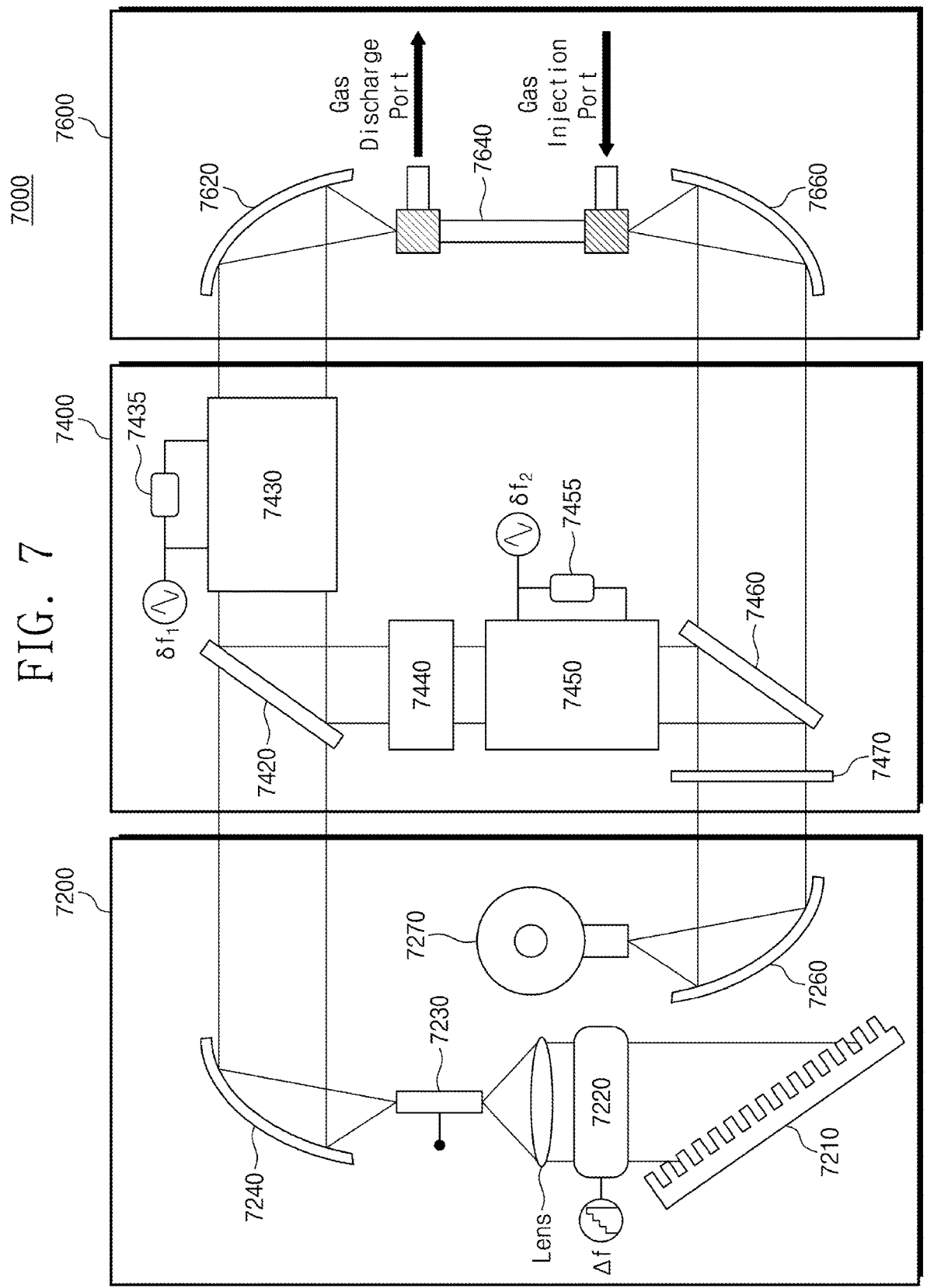
FIG. 7 illustrates a detailed configuration of a spectrometer used as a gas sensor according to an embodiment.

FIG. 7 illustrates a detailed configuration of a spectrometer used as a gas sensor according to an embodiment.

Referring to FIG. 7, a spectrometer 7000 may include a light transceiver 7200, a dual optical comb generator 7400, and a gas cell 7600. The light transceiver 7200, the dual optical comb generator 7400, and the gas cell 7600 may illustrate detailed embodiments of the light transceiver 6200, the dual optical comb generator 6400, and the gas cell 6600 of FIG. 6.

The operation of the light transceiver 7200 will be firstly described. Light output from a wavelength-tunable light source including a diffraction grating 7210, a beam deflector 7220, and an optical gain medium 7230 may be transmitted to a distributor 7420 via a reflector 7240 (for example, a mirror). The operation of a wavelength-tunable light source including the diffraction grating 7210, the beam deflector 7220, and the optical gain medium 7230 has been described with reference to FIG. 2, and thus detailed descriptions thereof will not be provided.

The distributor 7420 may split the light received from the reflector 7240 into first light and second light to proceed through two light paths (a first light path and a second light path) different from each other.

The first light path is a path reaching a coupler 7460 via a first light comb generator 7430, a reflector 7620, a gas tube 7640, and a reflector 7660. The first light comb generator 7430 may generate a first light comb from the first light. According to an embodiment, the first light comb generator 7430 may use a harmonic modulator 7435 to adjust a reference comb interval $\delta f_1$ of the first light comb. The first light comb passes through the reflector 7620 and then proceeds through the gas tube 7640. The first light comb having passed through the gas tube 7640 may be transmitted to the coupler 7460.

The second light path is a path reaching the coupler 7460 after passing through an acousto optic modulator (AOM) 7440, which performs the function of moving the wavelength of single mode light, and a second light comb generator 7450. The second light comb generator 7450 may generate a second light comb from the second light. According to an embodiment, the second light comb generator 7450 may use a harmonic modulator 7455 to adjust a reference comb interval $\delta f_2$ of the second light comb. The second light comb may be transmitted to the coupler 7460.

The coupler 7460 may couple the second light comb received from the second light comb generator 7450 and the first light comb received from the gas cell 7600, and generate a combined optical signal. According to an embodiment, the combined optical signal may be a signal generated because the first light comb and the second light comb interfere with each other in the time domain. The coupler 7460 may filter (for example, low-pass filtering) the combined optical signal through a filter 7470. The filtered optical signal may be transmitted to the photodiode 7270 via a reflector 7260.

The photodiode 7270 may convert the combined optical signal received from the coupler 7460 into an electrical signal. The electrical signal generated by the photodiode 7270 may be frequency-transformed (for example, Fourier transform), and the frequency-transformed optical signal may be used to analyze the absorbance and/or components of the sample inside the gas tube 7640.

Figure 8:
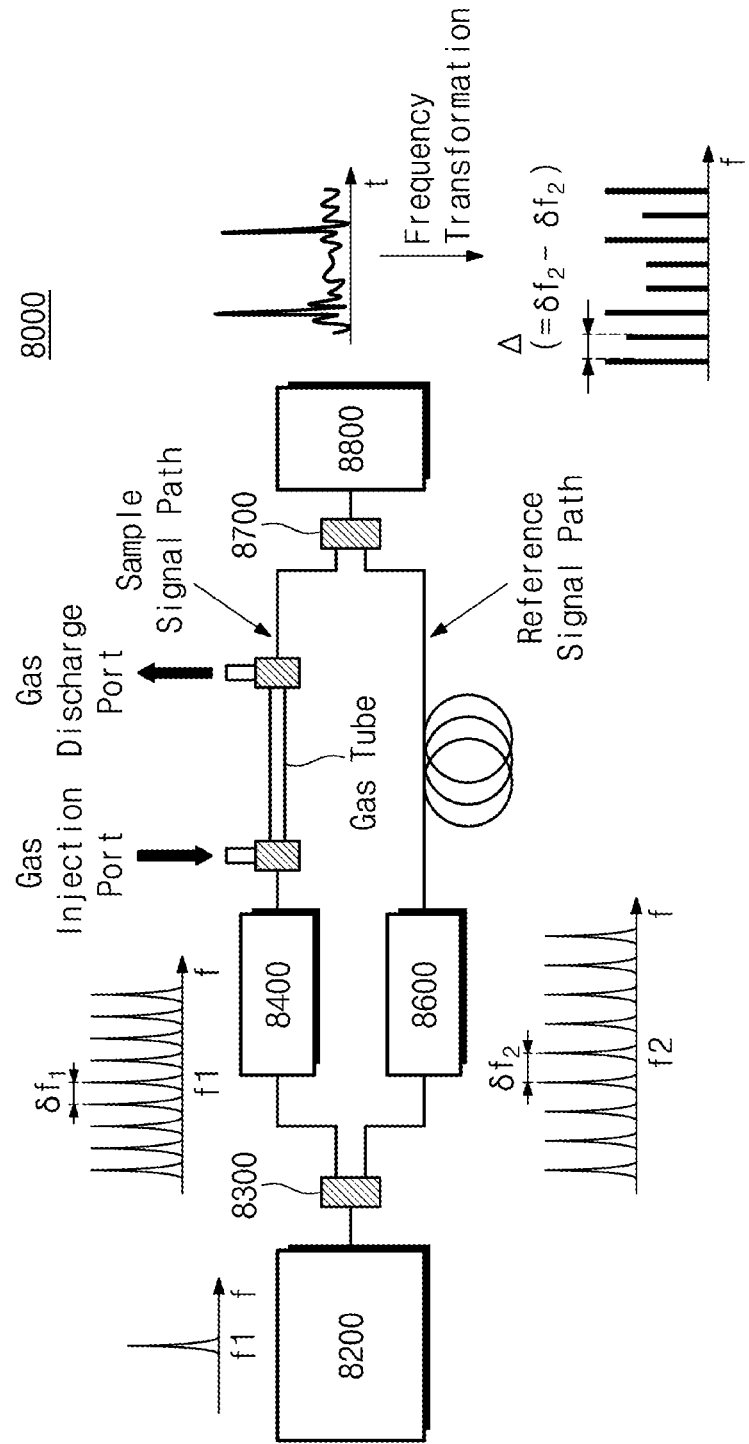
FIG. 8 illustrates a configuration of a spectrometer used as a gas sensor according to an embodiment.

FIG. 8 illustrates a configuration of a spectrometer used as a transmissive gas sensor according to an embodiment. A spectrometer 8000 of FIG. 8 is an embodiment in which the spectrometer 6000 of FIG. 6 is implemented on the basis of optical fibers. Accordingly, hereinafter although omitted, the matters described about the spectrometer 6000 of FIG. 6 may also be applied to the spectrometer 8000 of FIG. 8.

A wavelength-tunable light source 8200 may output light in a mid-infrared wavelength band. The light (wavelength: f1) output from the wavelength-tunable light source 8200 is transmitted to a 1×2 distributor 8300.

The light (wavelength: f1) output from the wavelength-tunable light source 8200 may pass through the 1×2 distributor 8300 and be split into first light and second light. The first light and the second light may respectively proceed to a first light comb generator 8400 and a second light comb generator 8600.

The first light comb generator 8400 may generate, from the first light, a first light comb which has a comb interval $\delta f_1$. The second light comb generator 8600 may generate, from the second light, a second light comb which has a comb interval of $\delta f_2$. The first light comb may proceed along sample signal path reaching a 2×1 coupler 8700 after passing through a gas tube, and the second light comb may proceed along a reference signal path reaching the 2×1 coupler 8700 after passing through an optical line without passing through a gas tube.

The first light comb and the second light comb pass through the 2×1 coupler 8700 and are then incident to a photodiode 8800. The photodiode 8800 converts an optical signal, generated because the first light comb and the second light comb interfere with each other in the time domain, into an electrical signal, and may thereby generate a time-domain interference pattern. According to an embodiment, the time-domain interference pattern is frequency-transformed, so that an envelope pattern having a frequency interval corresponding to the difference ($\delta f_2 - \delta f_1$) of comb intervals is obtained, and the characteristic of a gas may be analyzed on the basis of the envelope pattern.

Figure 9:
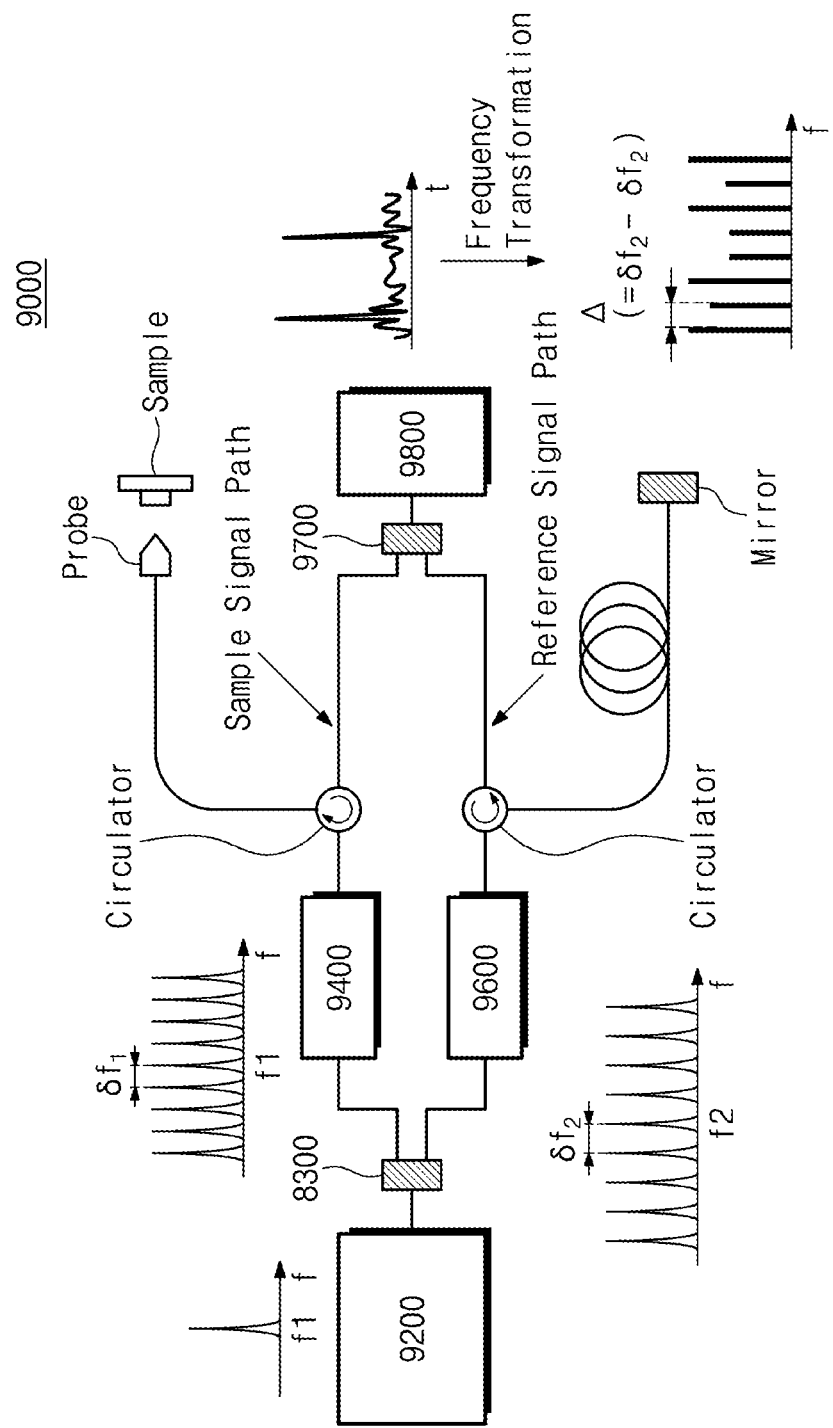
FIG. 9 illustrates a configuration of a spectrometer used as a gas sensor according to an embodiment.

FIG. 9 illustrates a configuration of a spectrometer which may be used as a reflective gas sensor according to an embodiment.

A spectrometer 9000 is another type of the spectrometer 8000 described above with reference to FIG. 8. Thus, hereinafter although omitted, matters described in FIG. 8 about the light source 8200, the 1×2 distributor 8300, the first light comb generator 8400, the second light comb generator 8600, the 2×1 coupler 8700, and the photodiode 8800 may also be applied, in FIG. 9, to a light source 9200, a 1×2 distributor 9300, a first light comb generator 9400, a second light comb generator 9600, a 2×1 coupler 9700, and a photodiode 9800.

The spectrometer 9000 of FIG. 9 is different from the spectrometer 8000 of FIG. 8 in that in order to analyze the characteristics of a sample, a first light comb reflected from the sample and a second light comb reflected from a mirror are used. For example, the first light comb output from the first light comb generator 9400 is reflected from the sample, and may proceed through a sample signal path reaching the coupler through a probe and a circulator. The second light comb output from the second light comb generator 9600 is reflected from a mirror, and may proceed through a reference signal path reaching the coupler through an optical line and a circulator.

The coupler may receive the first light comb reflected from the sample and the second light comb reflected from the mirror. The spectrometer 9000 has a configuration which can be used in an environment in which a transmissive type is not easily implemented or in tomography such as optical coherent tomography (OCT).

A light comb generating device according to an embodiment disclosed herein may change the wavelength of the light output from a light source for every reference time in a discrete manner, so that the problem of an increase in the line width of output light and decrease in light output may be improved, and a high-speed operation may be performed. In addition, the light comb generating device may generate a broadband light comb through combination of a wavelength-tunable light source and an optical comb generator, and thereby be implemented at low costs with low power.

The above descriptions are intended to provide exemplary configurations and operations for implementing the present disclosure. The technical idea of the present disclosure may include not only the aforementioned embodiments but also the embodiments that can be obtained by simply changing or modifying the embodiments. In addition, the technical idea of the present disclosure may include embodiments that will be achieved by simply changing or modifying the aforementioned embodiments.

What is claimed is:

1. A light comb generating device comprising:
  a light source configured to generate light in a mid-infrared wavelength band of at least about 3 µm and no greater than about 30 µm and to modulate and output the generated light; and
  an optical comb generator configured to generate a light comb having a reference comb interval from the output light,
  wherein the light source changes the wavelength of the output light stepwise as much as a reference frequency interval for every reference time interval, and the light comb is generated within a wavelength range of the reference frequency interval.

2. The light comb generating device of claim 1, wherein the light source comprises a diffraction grating, a beam deflector, and an optical gain medium, and
  light generated by applying a current to the optical gain medium passes through the beam deflector and the diffraction grating, whereby the light in the mid-infrared wavelength band is generated.

3. The light comb generating device of claim 1, wherein the optical comb generator comprises a harmonic modulator configured to generate a harmonic wave of the light corresponding to a modulation frequency to change the reference comb interval.

4. The light comb generating device of claim 3, wherein the harmonic modulator comprises a Mach-Zender modulator which is a parallel combination of phase modulators.

5. A spectrometer comprising:
  a cell configured to fill a sample thereinto;
  a light transceiver configured to transmit or receive light in a reference wavelength band; and
  a dual optical comb generator configured to split the light received from the light transceiver into first light and second light, and generate a first light comb from the first light and generate a second light comb from the second light, wherein:
  the dual optical comb generator comprises a distributor configured to separate the first light and the second light from the received light,
  the first light comb and the second light comb respectively have a first frequency interval and a second frequency interval, the first light comb returns to the dual optical comb generator after passing through the cell, and
  the dual optical comb generator transmits an optical signal in which the generated second light comb and the returned first light comb are combined.

6. The spectrometer of claim 5, wherein the reference wavelength band is at least about 3 µm and no greater than about 30 µm.

7. The spectrometer of claim 5, wherein the light transceiver comprises:
  a light source configured to generate the light in the reference wavelength band and outputting the generated light; and
  a photodiode configured to convert the combined optical signal received from the dual optical comb generator into an electrical signal.

8. The spectrometer of claim 7, wherein
  the light source comprises a diffraction grating, a beam deflector, and an optical gain medium, and
  light generated by applying a current to the optical gain medium passes through the beam deflector and the diffraction grating, whereby the light in the reference wavelength band is generated.

9. The spectrometer of claim 5, wherein the dual optical comb generator comprises:
  a first light comb generator configured to generate the first light comb from the first light; and
  a second light comb generator configured to generate the second light comb from the second light.

10. The spectrometer of claim 9, wherein
  the first light comb and the second light comb respectively have a first reference comb interval and a second reference comb interval,
  the first light comb generator comprises a first harmonic modulator configured to adjust the first reference comb interval, and
  the second light comb generator comprises a second harmonic modulator configured to adjust the second reference comb interval.

11. The spectrometer of claim 9, wherein the dual optical comb generator further comprises a coupler configured to receive the generated second light comb and the returned first light comb, and combine the received second light comb and the first light comb to generate an optical signal.

12. The spectrometer of claim 5, wherein the cell comprises a gas tube in which the first comb proceeds.

13. The spectrometer of claim 5, wherein the combined optical signal is frequency-transformed, and absorbance or components of the sample is analyzed.

* * * * *